US010002821B1

(12) United States Patent
Hoegerl

(10) Patent No.: US 10,002,821 B1
(45) Date of Patent: Jun. 19, 2018

(54) SEMICONDUCTOR CHIP PACKAGE COMPRISING SEMICONDUCTOR CHIP AND LEADFRAME DISPOSED BETWEEN TWO SUBSTRATES

(71) Applicant: Infineon Technologies AG, Neubiberg (DE)

(72) Inventor: Juergen Hoegerl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/720,985

(22) Filed: Sep. 29, 2017

(51) Int. Cl.
*H01L 23/495* (2006.01)
*H01L 25/18* (2006.01)
*H01L 23/00* (2006.01)
*H01L 23/31* (2006.01)

(52) U.S. Cl.
CPC .... *H01L 23/49582* (2013.01); *H01L 23/3114* (2013.01); *H01L 24/16* (2013.01); *H01L 24/27* (2013.01); *H01L 24/32* (2013.01); *H01L 25/18* (2013.01); *H01L 2924/1425* (2013.01)

(58) Field of Classification Search
CPC ..... H01L 2224/32225; H01L 2924/181; H01L 23/3735; H01L 2224/32145; H01L 23/49568; H01L 23/49861; H01L 23/485
USPC .......... 257/666, 686, 777; 438/110, 111, 123
See application file for complete search history.

(56) References Cited

U.S. PATENT DOCUMENTS

| 7,307,858 B2 | 12/2007 | Kuratli |
| 8,304,884 B2 | 11/2012 | Nikitin et al. |
| 8,508,975 B2 | 8/2013 | Toba et al. |
| 9,041,183 B2 | 5/2015 | Liang et al. |
| 9,082,742 B2 | 7/2015 | Kawakubo |
| 9,105,579 B2 | 8/2015 | Hyland et al. |
| 9,275,926 B2 | 3/2016 | Hable et al. |
| 9,390,996 B2 | 7/2016 | Jeon |
| 9,418,909 B1 | 8/2016 | Chaware et al. |

(Continued)

FOREIGN PATENT DOCUMENTS

| DE | 10303103 A1 | 8/2004 |
| DE | 102004050792 A1 | 4/2006 |

(Continued)

OTHER PUBLICATIONS

Moor, "Power Electronics for Electric Drive," Electric Drive Association, 08 Conference & Exposition, Dec. 2-4, 2008, 11 pp.

*Primary Examiner* — S. V. Clark
(74) *Attorney, Agent, or Firm* — Shumaker & Sieffert, P.A.

(57) ABSTRACT

The semiconductor chip package comprises
first substrate comprising insulator layer, first metallic layer, and second metallic layer;
first semiconductor chip disposed on first metallic layer of first substrate;
first electrically conductive spacer layer disposed on first semiconductor chip;
second substrate comprising insulator layer, first metallic layer, and second metallic layer, wherein second substrate is disposed on first spacer layer;
leadframe comprising first lead and second lead, wherein each one of first and second leads comprises upper surface and lower surface, wherein upper surfaces are connected with second metallic layer of second substrate, and lower surfaces are connected with first metallic layer of first substrate; and
encapsulant applied to first and second substrates, first semiconductor chip, first spacer layer, and leadframe.

20 Claims, 7 Drawing Sheets

(56) References Cited

U.S. PATENT DOCUMENTS

| | | | |
|---|---|---|---|
| 9,449,895 B2 | 9/2016 | Yoo et al. | |
| 9,484,275 B2 | 11/2016 | Xu et al. | |
| 9,496,198 B2 | 11/2016 | Venugopal et al. | |
| 9,496,228 B2 | 11/2016 | Fuergut et al. | |
| 9,613,885 B2 | 4/2017 | Yoo et al. | |
| 9,648,769 B2 | 5/2017 | Tramet et al. | |
| 9,673,118 B2 | 6/2017 | Taya | |
| 9,693,487 B2 | 6/2017 | Choi et al. | |
| 2001/0018235 A1* | 8/2001 | Choi | H01L 23/3121 438/122 |
| 2006/0197219 A1 | 9/2006 | Lee et al. | |
| 2009/0194862 A1 | 8/2009 | Kitami | |
| 2011/0316143 A1 | 12/2011 | Noritake et al. | |
| 2012/0069524 A1 | 3/2012 | Schulz-Harder et al. | |
| 2012/0175755 A1 | 7/2012 | Bayerer | |
| 2012/0306086 A1 | 12/2012 | Sugimura et al. | |
| 2014/0167237 A1* | 6/2014 | Yoo | H01L 24/73 257/676 |
| 2015/0115452 A1* | 4/2015 | Yoon | H01L 24/29 257/762 |
| 2015/0221569 A1 | 8/2015 | Palm et al. | |
| 2016/0035637 A1 | 2/2016 | Urago et al. | |
| 2016/0233141 A1 | 8/2016 | Hirobe | |
| 2016/0240505 A1 | 8/2016 | Tatsumi et al. | |
| 2017/0025344 A1 | 1/2017 | Kanai | |
| 2017/0287875 A1* | 10/2017 | Gao | H01L 25/0657 |
| 2018/0005927 A1* | 1/2018 | Liu | H01L 23/49524 |

FOREIGN PATENT DOCUMENTS

| | | |
|---|---|---|
| DE | 202009000615 U1 | 7/2010 |
| DE | 102010003533 A1 | 10/2011 |
| DE | 102011079660 A1 | 1/2013 |
| DE | 102013102637 A1 | 9/2014 |
| DE | 102014101366 B3 | 5/2015 |
| EP | 2019429 A1 | 1/2009 |
| EP | 2164100 A2 | 3/2010 |
| EP | 2521175 A1 | 11/2012 |
| EP | 2840607 A1 | 2/2015 |
| EP | 2940731 A1 | 11/2015 |
| EP | 2996144 A1 | 3/2016 |
| WO | 2002078088 A1 | 10/2002 |
| WO | 2004034428 A2 | 4/2004 |
| WO | 2016050451 A1 | 4/2016 |

* cited by examiner

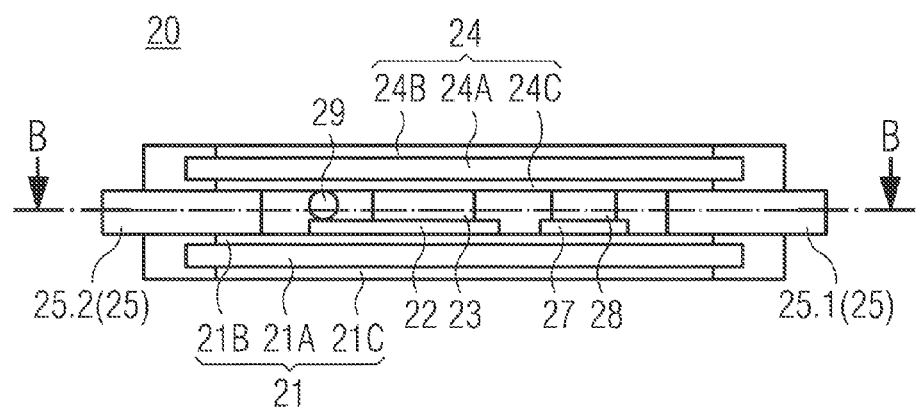
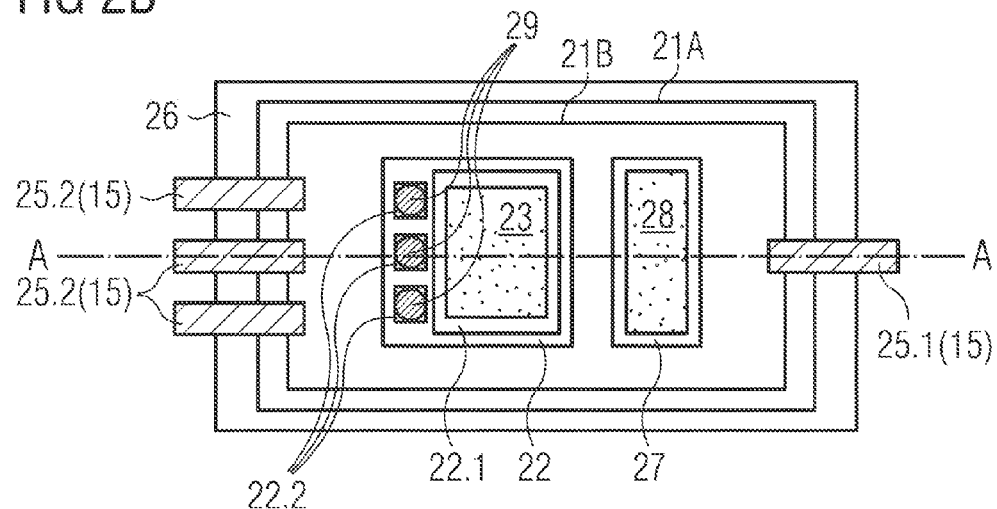

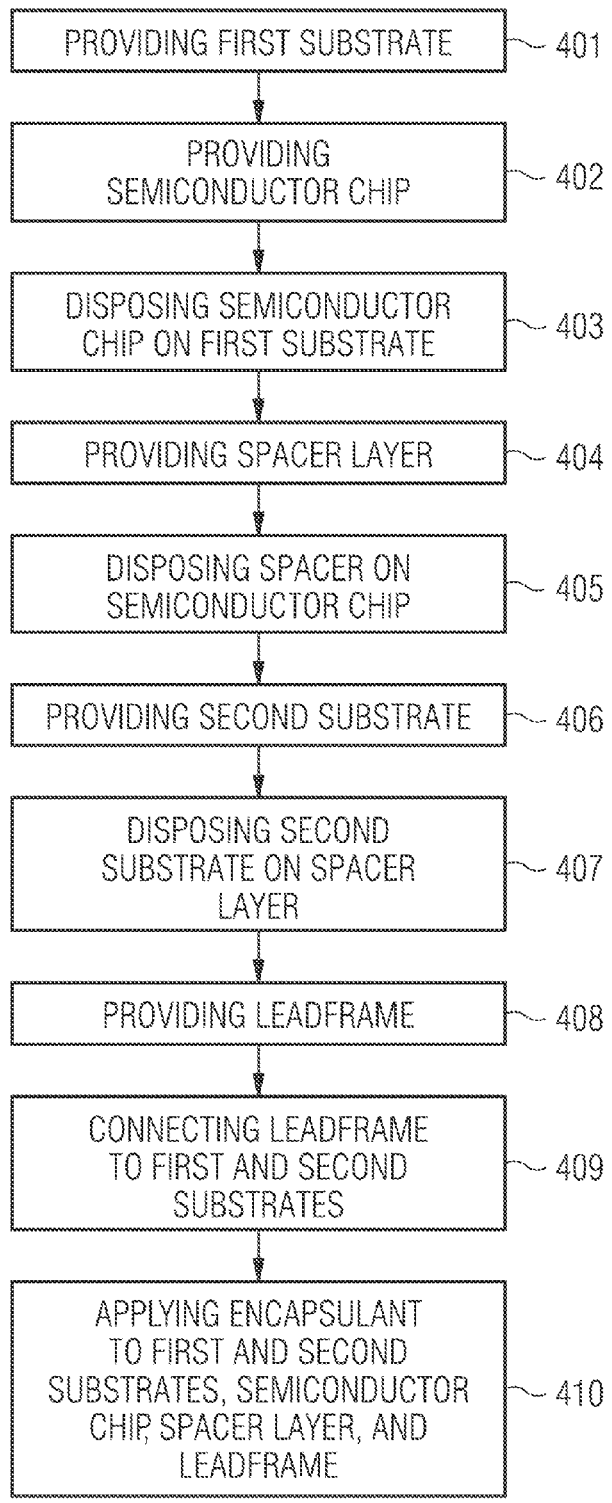

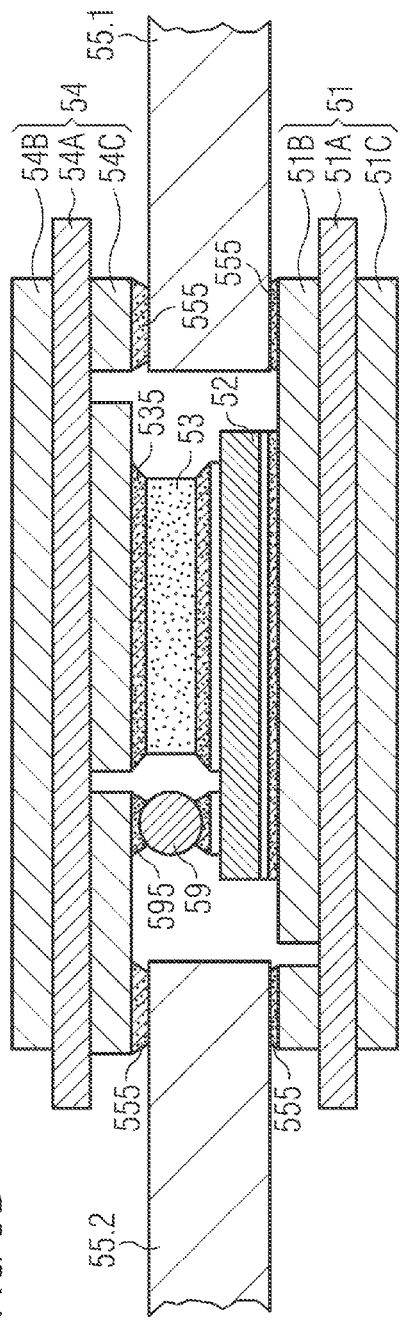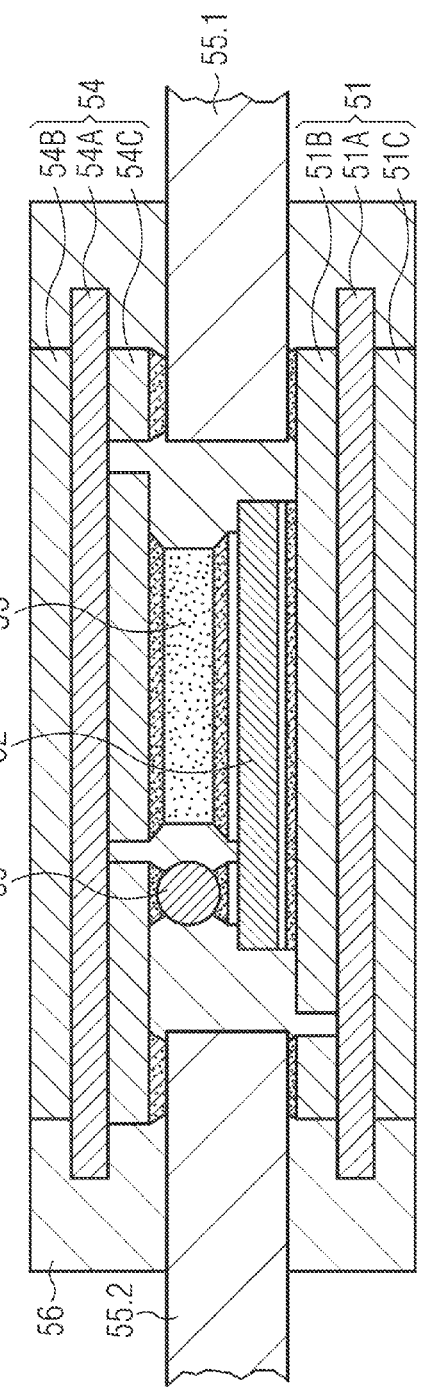

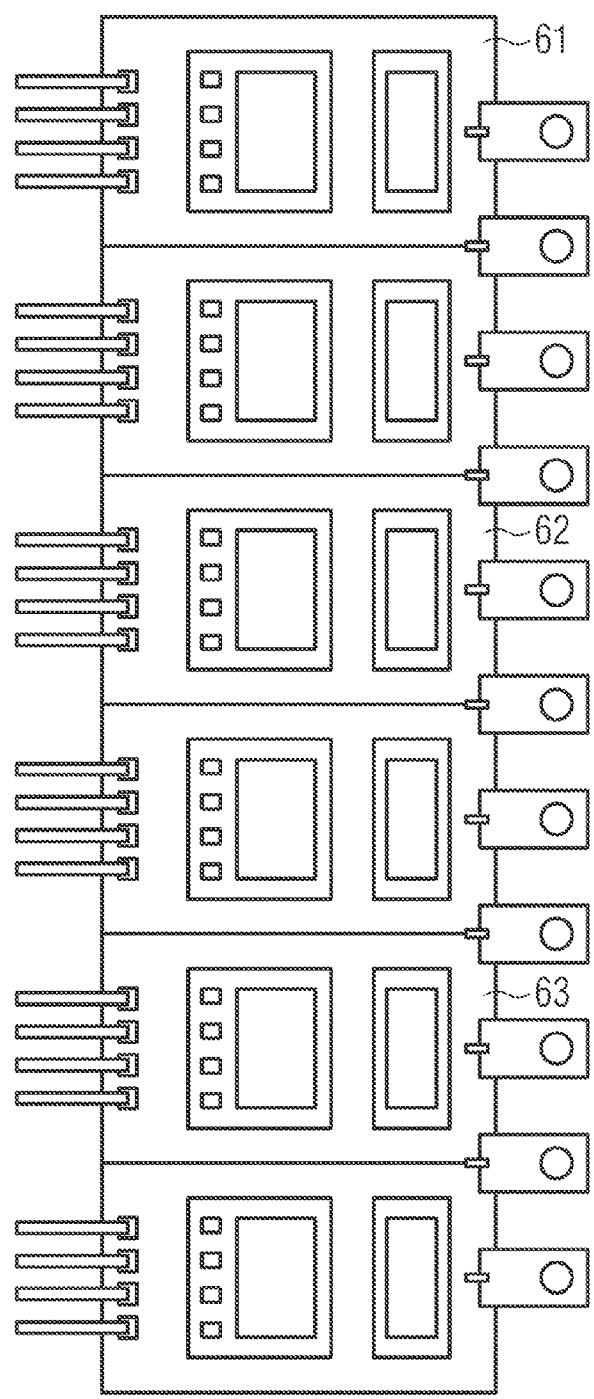

SEMICONDUCTOR CHIP PACKAGE COMPRISING SEMICONDUCTOR CHIP AND LEADFRAME DISPOSED BETWEEN TWO SUBSTRATES

TECHNICAL FIELD

The present disclosure relates to a semiconductor chip package, an electronic module, and a method for fabricating a semiconductor chip package.

BACKGROUND

In many electronic systems it is necessary to employ converters like DC/DC converters, AC/DC converters, or DC/AC converters in order to generate the currents and voltages to be used by an electronic circuit. A buck converter typically comprises one or more half-bridge circuits, each provided by two semiconductor power switches, such as power MOSFET devices, and further components such as diodes, inductors, and capacitors. An important aspect in the further development of these types of semiconductor chip packages is the further improvement of the compactness of the package with the aim of allowing efficient heat dissipation.

SUMMARY

In accordance with a first aspect of the disclosure, a semiconductor package comprises
 a first substrate comprising an insulator layer, a first metallic layer disposed on a first upper main face of the insulator layer, and a second metallic layer disposed on a second lower main face of the insulator layer;
 a first semiconductor chip comprising a first upper main face and a second lower main face, a first contact pad disposed on the first main face, and a second contact pad disposed on the second main face, wherein the first semiconductor chip is disposed on the first metallic layer of the first substrate, wherein the second contact pad is electrically connected with the first metallic layer;
 a first electrically conductive spacer layer disposed on the first upper main face of the first semiconductor chip, wherein the first contact pad is electrically connected with the first spacer layer, a second substrate comprising an insulator layer, a first metallic layer disposed on a first upper main face of the insulator layer, and a second metallic layer disposed on a second lower main face of the insulator layer, wherein the second substrate is disposed on the first spacer layer, wherein the second metallic layer is electrically connected with the first spacer layer;
 a leadframe comprising a first lead and a second lead, wherein the first and second leads are disposed on opposing sides of the package and each one of the first and second leads comprises an upper surface and a lower surface, wherein the upper surfaces are connected with the second metallic layer of the second substrate, and the lower surfaces are connected with the first metallic layer of the first substrate; and
an encapsulant applied to the first and second substrates, the first semiconductor chip, the first spacer layer, and the leadframe.

In accordance with a second aspect of the disclosure, a method for fabricating a semiconductor chip package comprises
 providing a first substrate comprising an insulator layer, a first metallic layer disposed on a first upper main face of the insulator layer, and a second metallic layer disposed on a second lower main face of the insulator layer;
 providing a first semiconductor chip having a first upper main face and a second lower main face, a first contact pad disposed on the first main face, and a second contact pad disposed on the second main face;
 disposing the first semiconductor chip on the first metallic layer of the substrate;
 providing a first electrically conductive spacer layer;
 disposing the first spacer layer on the first upper main face of the first semiconductor chip so that the first contact pad is electrically connected with the first spacer layer;
 providing a second substrate comprising an insulator layer, a first metallic layer disposed on a first main face of the insulator layer, and a second metallic layer disposed on a second lower main face of the insulator layer;
 disposing the second substrate on the first spacer layer;
 providing a leadframe comprising a first lead and a second lead disposed in an opposing relationship to each other, each one of the first and second leads comprising an upper surface and a lower surface;
 connecting the leadframe to the substrate by connecting the upper surfaces of the first and second leads with the second metallic layer of the second substrate, and connecting the lower surfaces of the first and second leads with the first metallic layer of the first substrates; and
 applying an encapsulant to the first and second substrates, the first semiconductor chip, the first spacer layer, and the leadframe.

In accordance with a third aspect of the disclosure, an electronic module comprises two or more semiconductor chip packages, wherein each one of the semiconductor chip packages comprises:
 a first substrate comprising an insulator layer, a first metallic layer disposed on a first upper main face of the insulator layer, and a second metallic layer disposed on a second lower main face of the insulator layer;
 a first semiconductor chip comprising a first upper main face and a second lower main face, a first contact pad disposed on the first main face, and a second contact pad disposed on the second main face, wherein the first semiconductor chip is disposed on the first metallic layer of the first substrate, wherein the second contact pad is electrically connected with the first metallic layer;
 a first electrically conductive spacer layer disposed on the first upper main face of the first semiconductor chip, wherein the first contact pad is electrically connected with the first spacer layer;
 a second substrate comprising an insulator layer, a first metallic layer disposed on a first upper main face of the insulator layer, and a second metallic layer disposed on a second lower main face of the insulator layer, wherein the second substrate is disposed on the first spacer layer, wherein the second metallic layer is electrically connected with the first spacer layer;
 a leadframe comprising a first lead and a second lead, wherein the first and second leads are disposed on opposing sides of the package and each one of the first and second leads comprises an upper surface and a lower surface, wherein the upper surfaces are connected with the second metallic layer of the second substrate, and the lower surfaces are connected with the first metallic layer of the first substrate; and an encapsulant applied to the first and second substrates, the first semiconductor chip, the first spacer layer, and the leadframe.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

FIGS. 2A and 2B show a schematic cross-sectional side view representation (FIG. 2A) and a schematic cross-sectional view from a plane B-B in FIG. 2A (FIG. 2B) of a semiconductor chip package according to an example of the first aspect of the disclosure in which example two semiconductor chips are sandwiched between two substrates and electrically connected with each other.

FIG. 4 shows a flow diagram for illustrating a method for fabricating a semiconductor chip package according to an example of the second aspect of the disclosure.

FIGS. 5A to 5E and shows schematic cross-sectional side view representations for illustrating a method for fabricating a semiconductor chip package according to an example of the second aspect of the disclosure in which example only one semiconductor transistor chip is shown and in which the gate contact element is connected by a solder ball to the second metallic layer of the upper substrate.

FIG. 6 shows a schematic top view representation of an electronic module according to an example of the third aspect of the disclosure in which example the electronic module comprises three semiconductor chip packages electrically connected with each other wherein each one of the semiconductor chip packages maybe configured like the one shown in FIGS. 3A and 3B.

DETAILED DESCRIPTION

Figure 1A:
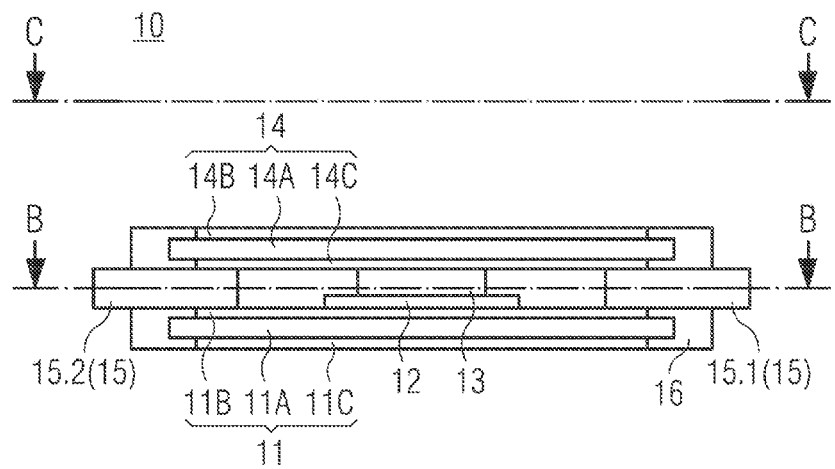
FIGS. 1A to 1C show a schematic cross-sectional side view representation (FIG. 1A), a schematic cross-sectional view from a plane B-B in FIG. 1A (FIG. 1B), and a schematic view from a plane C-C in FIG. 1A (FIG. 1C) of a semiconductor chip package according to an example of the first aspect of the disclosure in which example only one semiconductor chip is sandwiched between two substrates.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise".

The terms "coupled" and "connected", along with derivatives may be used. It should be understood that these terms may be used to indicate that two elements co-operate or interact with each other regardless whether they are in direct connection with each other, or whether they are not in direct connection with each other. A direct connection can have the meaning of a positive or form-fitting connection of two elements. Also, even if two elements are described to be in direct connection with each other, there can still be a layer like, for example, a solder layer, a sinter layer or a glue layer between the two elements, which layer has only the function of effectuating and ensuring the connection between the two elements.

The semiconductor chip package according to the first aspect comprises first and second substrates both comprising an insulator layer covered with metallic layers on both of its main surfaces. According to an example, the insulator layer may comprise a ceramic material. According to a further example, the substrate can be a direct copper bonded (DCB) substrate, a direct aluminum bonded (DAB) substrate, or an active metal brazing (AMB) substrate. According to another example, the substrate can be an insulated metal substrate (IMS).

The examples of a semiconductor chip package comprise a first semiconductor chip which may comprise a transistor device. The transistor device may comprise an MOS transistor structure or an IGBT (insulated gate bipolar transistor) structure, wherein those structures may be provided in a form in which at least one electrical contact element is arranged on a first main face of the semiconductor die and at least one other electrical contact element is arranged on a second main face opposite to the first main face of the semiconductor die (vertical transistor structures).

Figure 1B:
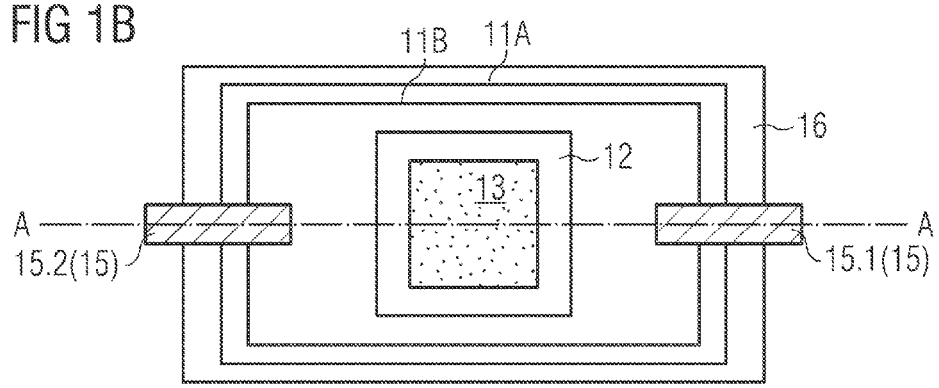
Figure 1C:
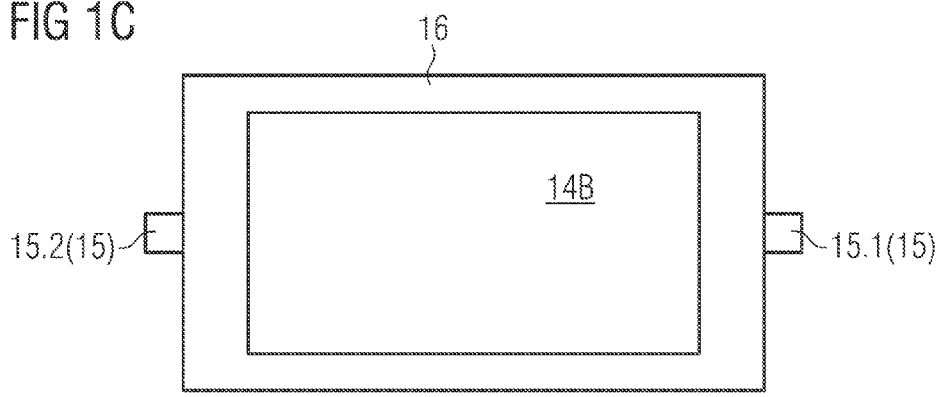

FIGS. 1A-1C depict an example of a semiconductor chip package according to the first aspect. The cross-sectional view of FIG. 1A has been taken along a plane indicated by line A-A in FIG. 1B. The cross-sectional view of FIG. 1B is a down view from a plane indicated by line B-B in FIG. 1A. The view as shown in FIG. 1C has been taken from a plane indicated by line C-C in FIG. 1A.

The semiconductor chip package 10 of FIGS. 1A to 1C comprises a first substrate 11 comprising an insulator layer 11A, a first metallic layer 11B disposed on a first upper main face of the insulator layer 11A, and a second metallic layer 11 disposed on a second lower main face of the insulator layer 11A. According to an example, the first substrate 11 can be a direct bonded copper (DCB), wherein the insulator layer 11A comprises a ceramic material, and the first and second metallic layers 11B and 11C are comprised of copper layers.

The semiconductor chip package 10 of FIGS. 1A to 1C further comprises a semiconductor chip 12 comprising a first upper main face and a second lower main face, a first contact pad (not shown) disposed on the first main face, and a second contact pad (not shown) disposed on the second main face, wherein the semiconductor chip 12 is disposed on the first metallic layer 11B of the first substrate 11, wherein the second contact pad is electrically connected with the first metallic layer 11B.

The semiconductor chip package 10 of FIGS. 1A to 1C further comprises an electrically conductive spacer layer 13 disposed on the first upper main face of the semiconductor chip 12, wherein the first contact pad is electrically connected with the spacer layer 13. The spacer layer 13 can be fabricated of Cu, a Cu alloy, or a Cu refractory material. The latter can, for example, be a layer stack of alternating layers of copper and molybdenum. The selection of the material of the spacer layer depends i.a. on the requirement to achieve an optimal CTE match with the encapsulant 16. The thickness of the spacer layer can be in a range from 300 μm to 1300 μm, depending on the thickness of the leads of the leadframe.

The semiconductor chip package 10 of FIGS. 1A to 1C further comprises a second substrate 14 comprising an insulator layer 14A, a first metallic layer 14B disposed on a first upper main face of the insulator layer 14A, and a second metallic layer 14C disposed on a second lower main face of the insulator layer 14A. The second substrate 14 can also be a direct bonded copper (DCB), wherein the insulator layer 14A comprises a ceramic material, and the first and second metallic layers 14B and 14C are comprised of copper layers.

The second substrate 14 is disposed on the spacer layer 13, wherein the second metallic layer 14C is electrically connected with the spacer layer 13.

The semiconductor chip package 10 of FIGS. 1A to 1C further comprises a leadframe 15 comprising a first lead 15.1 and a second lead 15.2, wherein the first and second leads 15.1 and 15.2 are disposed on opposing sides of the semiconductor chip package 10. As can be seen in FIG. 1A, each one of the first and second leads 15.1 and 15.2 comprises an upper surface and a lower surface, wherein the upper surfaces are connected with the second metallic layer 14C of the second substrate 14, and the lower surfaces are connected with the first metallic layer 11B of the first substrate 11. There can also be two or more first leads 15.1 and two or more second leads 15.2 as will be shown later.

The semiconductor chip package 10 of FIGS. 1A to 1C further comprises an encapsulant 16 applied to the first and second substrate 11 and 14, the semiconductor chip 12, the spacer layer 13, and the leadframe 15.

As shown in the example of FIGS. 1A to 1C, the upper surfaces of the first and second leads 15.1 and 15.2 can be one or more of positively, form-fittingly or directly connected with the second metallic layer 14C of the second substrate 14, and the lower surfaces of the first and second leads 15.1 and 15.2 can be one or more of positively, formed-fittingly or directly connected with the first metallic layer 11B of the first substrate 11. The connections can be formed by soldering or sintering, which means that a solder layer or a sinter layer can be provided between the first and second leads 15.1 and 15.2 and the metallic layers 11B and 14C, respectively.

The semiconductor chip 12 can be a semiconductor transistor chip having a vertical structure, in particular an insulated gate bipolar transistor (IGBT) chip. The first contact pad of the semiconductor chip 12 can thus be an emitter contact pad located at the first upper main face of the semiconductor chip 12 and being connected with the spacer layer 13, and the second contact pad can be a collector contact pad located at the second lower main face of the semiconductor chip 12 and being connected with the first metallic layer 11B of the substrate 11.

The material of the encapsulant 16 and of the encapsulants used in the other examples described below, can be any electrically insulating material like, for example, any kind of molding material, any kind of resin material, or any kind of epoxy material. The encapsulating material may also comprise any of the above-mentioned materials and further include filler materials embedded therein like, for example, thermally conductive increments. These filler increments, for example, can be made of AlO or $Al_2O_3$, AlN, BN, or SiN. The encapsulant may comprise one or more of a CTE (coefficient of thermal expansion) in a range from 14 to 18 ppm, a modulus of elasticity in a range from 18 to 22 MPa, a glass transition temperature (Tg) greater than 200° C., and a chemical shrink of less than 0.15%.

As further shown in the example of FIGS. 1A to 1C, the encapsulant 16 can be applied in such a way that it comprises a first lower main face and a second upper main face opposite to the first main face, and four side faces connecting the first and second main faces, wherein the first and second leads 15.1 and 15.2 extend through two opposing side faces. Furthermore, as can be seen in FIG. 1C, the encapsulant 16 can be applied in such a way that on the second upper main face the first metallic layer 14B of the second substrate 14 is exposed to the outside. Likewise, the encapsulant 16 can be applied in such a way that at the first lower main face the second metallic layer 11C of the substrate 11 can be exposed to the outside. Such a configuration allows to attach heat sinks to the first and second main faces or to let a cooling medium flow along the first and second main faces in order to efficiently dissipate heat from the semiconductor chip package 10.

According to an example of the semiconductor chip package 10 of FIGS. 1A to 1C, the second metallic layer 14C of the second substrate 14 is a structured layer comprising metallic lines connected with the first or second leads 15.1, 15.2 of the leadframe 15. The spacer layer 13 is thus connected with a particular electrical line of the metallic layer 14C. This connection can be also one or more of a positive, form-fitting and direct connection. There can be also a solder or sinter between the spacer layer 13 and the particular electrical line, but it is also possible that a solder or sinter layer is omitted here. The first metallic layer 11B of the first substrate 11 can likewise be structured so that, for example, the first semiconductor chip 12 is disposed on a particular portion of the metallic layer 11B.

FIGS. 2A and 2B show a further example of a semiconductor chip package according to the first aspect. The cross-sectional view, as shown in FIG. 2A, has been taken along a plane indicated by line A-A in FIG. 2B.

The semiconductor chip package 20 of FIGS. 2A and 2B comprises a substrate 21 which can be similar to the substrate 11 of the semiconductor chip package of FIGS. 1A to 1C, namely likewise comprising an insulator layer 21A covered by first and second metallic layers 21B and 21C on its upper and lower main faces. In the same way the semiconductor chip package 20 of FIGS. 2A and 2B comprises a substrate 24 which can be similar to the substrate 14 of the semiconductor chip package of FIGS. 1A to 1C, namely likewise comprising an insulator layer 24A covered by first and second metallic layers 24B and 24C on its upper and lower main faces.

The semiconductor chip package 20 of FIGS. 2A and 2B further comprises a first semiconductor chip 22 which can be similar to the semiconductor chip of the semiconductor chip package 10 of FIGS. 1A to 1C and can likewise be attached with its second contact pad on its second lower main face to the first metallic layer 21B of the substrate 21. The first semiconductor chip 22 can be a semiconductor transistor chip, in particular an IGBT chip. The first semiconductor chip 22 can be connected with its upper contact pad with a first spacer layer 23, which is connected with its upper surface with the second metallic layer 24C of the second substrate 24. The first spacer layer 23 can be similar to the spacer layer 13 of the semiconductor chip package 10 of FIG. 1 and can be fabricated of Cu, Cu alloy, or Cu refractory material.

The semiconductor chip package 20 of FIGS. 2A and 2B further comprises a second semiconductor chip 27 which may as well comprise a vertical structure having a first contact pad at a first upper main face and a second contact pad and a second lower main face. The second semiconductor chip 27 can be, for example, a semiconductor diode chip which is connected with its second contact pad with the first metallic layer 21B of the substrate 21. With its first upper contact pad the semiconductor diode chip 27 can be connected with a second spacer layer 28. The second spacer layer 28 can be similar to the first spacer layer 23 and can also be fabricated of Cu, Cu alloy, or Cu refractory material. The second spacer layer 28 can be connected with its upper surface with the second metallic layer 24C of the second substrate 24. The second semiconductor chip 27 is connected in parallel to the first semiconductor chip 22.

The semiconductor chip package 20 of FIGS. 2A and 2B further comprises a leadframe 25 comprising a first lead 25.1 and second leads 25.2. The upper surfaces of the first and second leads 25.1 and 25.2 are connected one or more of positively, form-fittingly or directly by a solder layer or a sinter layer with the second metallic layer 24C of the second substrate 24. The lower surfaces of the first and second leads 25.1 and 25.2 are connected one or more of positively, form-fittingly or directly by a solder layer or a sinter layer with the first metallic layer 21B of the first substrate 21.

The first semiconductor chip 22 can be a semiconductor transistor chip, in particular an insulated gate bipolar transistor (IGBT) chip. As shown in FIG. 2B, the semiconductor transistor chip 22 comprises on its upper main face an emitter contact pad 22.1 on which the first spacer layer 23 is disposed. The semiconductor transistor chip 22 further comprises signal contact pads 22.2 on which solder balls 29 are disposed which are connected with their upper surfaces with the second metallic layer 24C of the second substrate 24. The second metallic layer 24C of the second substrate 24 is a structured metallic layer so that the first spacer layer 23 and the solder balls 29 are connected with different metallic lines of the second metallic layer 24C.

According to an example of the semiconductor chip package 20, the first lead 25.1 is connected with the load paths of the first and second semiconductor chips 22 and 27, and the second leads 25.2 are connected with the signal contact pads 22.2 which can be, for example, a gate contact pad, a source-sense contact pad, or an emitter-sense contact pad. This means that the first leads 25.1 have to conduct high currents in the case of a power device (emitter-collector voltages higher than 1200V), and the second leads 25.2 only conduct signals of rather small currents.

The semiconductor chip package 20 of FIGS. 2A and 2B also comprises an encapsulant 26 which can be similar to the encapsulant 16 of the semiconductor chip package 10 of FIGS. 1A to 1C with respect to the material and the shape. In particular, the encapsulant 26 can be formed such that the second metallic layer 21C of the first substrate 21 and the first metallic layer 24B of the second substrate 24 are exposed to the outside.

Figure 3A:
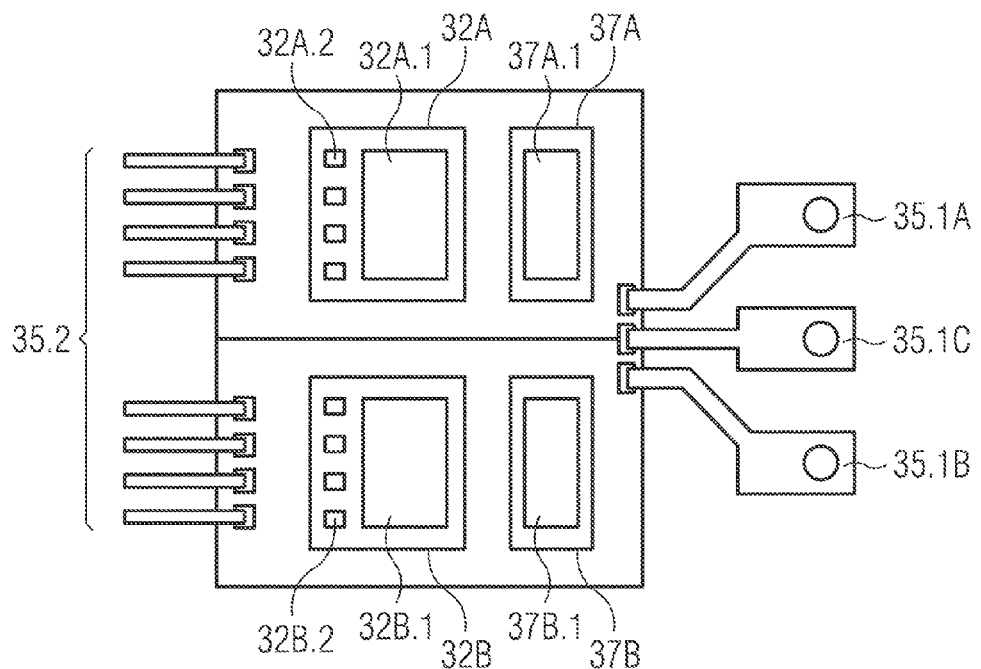
FIGS. 3A and 3B show a schematic top view representation of a semiconductor chip package according to an example of the first aspect of the disclosure in which example two semiconductor transistor chips and two semiconductor diode chips are provided and electrically connected with each other to form a half-bridge circuit (FIG. 3A) and a circuit diagram of the half-bridge circuit (FIG. 3B).
Figure 3B:
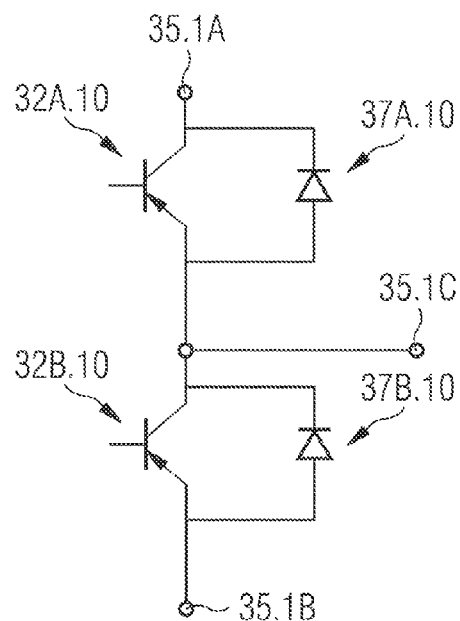

FIGS. 3A and 3B show another example of a semiconductor chip package according to the first aspect.

The semiconductor chip package 30 of FIGS. 3A and 3B comprises a first semiconductor transistor chip 32A, a second semiconductor transistor chip 32B, a first semiconductor diode chip 37A, and a second semiconductor diode chip 37B. The semiconductor chip package 30 is in principle a doubled variant of the semiconductor chip package 20 of FIGS. 2A and 2B. In particular, the first semiconductor transistor chip 32A is electrically connected in parallel to the first semiconductor diode chip 37A, the second semiconductor transistor chip 32B is electrically connected in parallel to the second semiconductor diode chip 37B, and the first and second semiconductor transistor chips 32A and 32B are connected in series with each other by means of the electrical lines and regions of the structured metallic layers of the first and second substrates (not shown here) such as the metallic layers 21B and 24C of the semiconductor chip package 20 of FIGS. 2A and 2B. FIG. 3B shows the equivalent circuit diagram in which a first IGBT 32A.10, as contained in the first semiconductor transistor chip 32A, is connected in parallel to a first diode 37A.10 contained in the first semiconductor diode chip 37A, and a second IGBT 32B.10 contained in the second semiconductor transistor chip 32B is connected in parallel to a second diode 37B.10 contained in the second chip 37B, and the two IGBTs 32A.10 and 32B.10 are connected in series.

The semiconductor chip package 30 also comprises a leadframe 35 comprising first leads 35.1A, 35.1B, and 35.1C and second leads 35.2, which are connected in such a way with the metallic layers of the two substrates that the first lead 35.1A is connected with the emitter contact pad 32A.1 of the first IGBT chip 32A and the anode contact pad 37A.1 of the first diode chip 37A, the second lead 35.1B is connected with the collector contact pad (not shown) of the second IGBT chip 32B and the cathode contact pad (not shown) of the second diode chip 37B. The first lead 35.1C is connected to a node between the first and second IGBT chips 32A and 32B. The second leads 35.2 are connected with the signal contact pads 32A.2 and 32B.2 of the first and second IGBT chips 32A and 32B, respectively.

FIG. 4 shows a flow diagram for illustrating a method for fabricating a semiconductor chip package according to a second aspect.

The method 400 of FIG. 4 comprises providing a first substrate comprising an insulator layer, a first metallic layer disposed on a first upper main face of the insulator layer, and a second metallic layer disposed on a second lower main face of the insulator layer (401). The first substrate can be, for example, a DCB substrate as shown in the examples of FIGS. 1-3. The first and second metallic layers are structured layers, wherein the structuring is such that it allows to later form electrical connections between semiconductor chips within the package as well as connect electrical contact pads of the semiconductor chips with leads of a leadframe.

The method 400 of FIG. 4 further comprises providing a semiconductor chip having a first upper main face and a second lower main face, a first contact pad disposed on the first main face, and a second contact pad disposed on the second main face (402). The semiconductor chip can be a semiconductor transistor chip, in particular an IGBT chip, wherein the first contact pad is an emitter contact pad and the second contact pad is a collector contact pad. The IGBT chip may further include signal contact pads on the first main face, wherein the signal contact pads may comprise a gate contact pad, a source-sense contact pad, and an emitter-sense contact pad.

The method 400 of FIG. 4 further comprises disposing the semiconductor chip on the first metallic layer of the substrate (403). The semiconductor chip can be disposed on the first metallic layer by soldering or sintering.

The method 400 of FIG. 4 further comprises providing an electrically conductive spacer layer (404). The spacer layer can, for example, be a pre-fabricated rectangular or cuboid block of a metal like Cu, or of a Cu alloy, or of a Cu refractory material, as was mentioned before.

The method 400 of FIG. 4 further comprises disposing the spacer layer on the first upper main face of the semiconductor chip so that the first contact pad is electrically connected with the spacer layer (405). The spacer layer can be disposed on the semiconductor chip by soldering or sintering.

The method 400 of FIG. 4 further comprises providing a second substrate comprising an insulator layer, a first metallic layer disposed on the first main face of the insulator layer, and a second metallic layer disposed on a second lower main face of the insulator layer. The second substrate can have similar or identical properties as the first substrate.

The method 400 of FIG. 4 further comprises disposing the second substrate on the spacer layer (407). The second substrate can be disposed on the spacer layer by soldering or sintering.

The method 400 of FIG. 4 further comprises providing a leadframe comprising first leads and second leads disposed in an opposing relationship to each other, each one of the first leads and the second leads comprising an upper surface and a lower surface (408).

The method 400 of FIG. 4 further comprises connecting the leadframe to the substrate by connecting the upper surfaces of the first and second leads with the second metallic layer of the second substrate, and connecting the lower surfaces of the first and second leads with the first metallic layer of the first substrate (409). The connections can be made one or more of positively, form-fittingly or directly. Moreover, they can be made by soldering or sintering so that as a result solder or sinter layers will remain between the upper and lower surfaces of the leads and the second metallic layer of the second substrate and the first metallic layer of the first substrate, respectively.

The method 400 of FIG. 4 further comprises applying an encapsulant to the first and second substrates, the semiconductor chip, the spacer layer, and the leadframe (410). The encapsulant can be applied by, for example, compression molding, transfer molding, or injection molding. Furthermore, the encapsulant can be applied in such a way that in the resulting package, portions of the outer metallic layers of the first and second substrates are exposed to the outside.

According to an example of the method 400 of FIG. 4, connecting the leadframe to the substrate comprises simultaneously connecting the upper surfaces of the first and second leads with the second metallic layer of the second substrate and connecting the lower surfaces of the first and second leads with the first metallic layer of the first metallic layer of the first substrate.

FIGS. 5A to 5E show cross-sectional side view representations for illustrating a further exemplary method for fabricating a semiconductor chip package according to the second aspect.

Figure 5A:
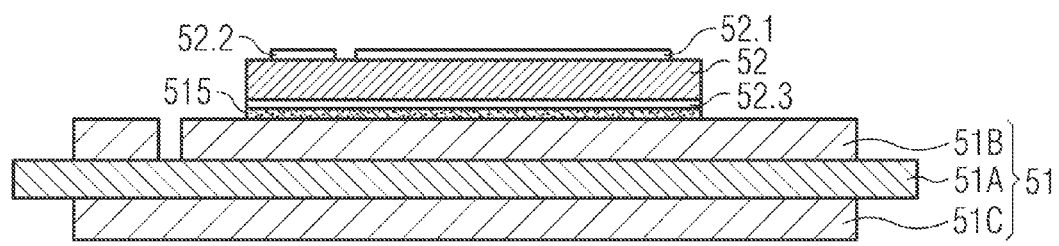

FIG. 5A shows an intermediate product of the method obtained after 403 in FIG. 4. The intermediate product comprises a substrate 51 comprising an insulating layer 51A, an upper first metallic layer 51B, and a second lower metallic layer 51C. The substrate 51 can be a DCB, for example. An IGBT chip 52 has been attached on an upper surface of the first metallic layer 51B by soldering or sintering resulting in a solder or sinter layer 515 between the IGBT chip 52 and the metallic layer 51B. The first metallic layer 51B is a structured metallic layer. The IGBT chip 52 comprises on its upper surface an emitter contact pad 52.1 and a signal contact pad 52.2, and on a lower surface a collector contact pad 52.3.

Figure 5B:
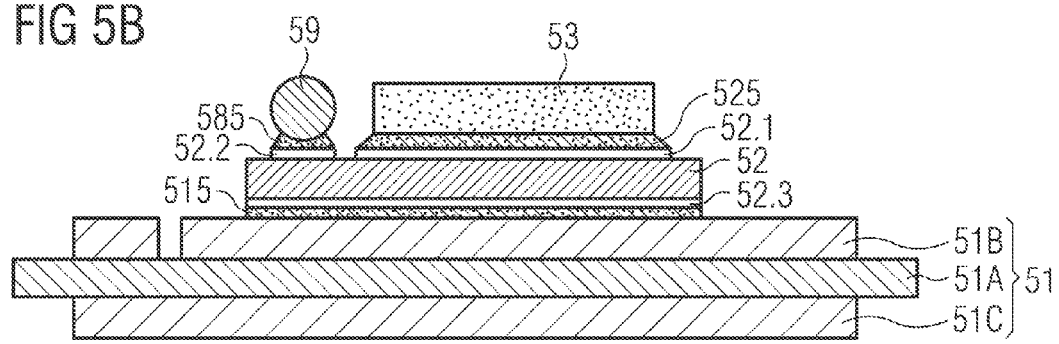

FIG. 5B shows an intermediate product of the method after 405 of FIG. 4. A spacer layer 53 has been attached to the emitter contact pad 52.1 and a solder ball 59 has been attached to the gate contact pad 52.2, both by either soldering or sintering wherein reference signs 525 and 585 denote the respective solder or sinter layers.

Figure 5C:
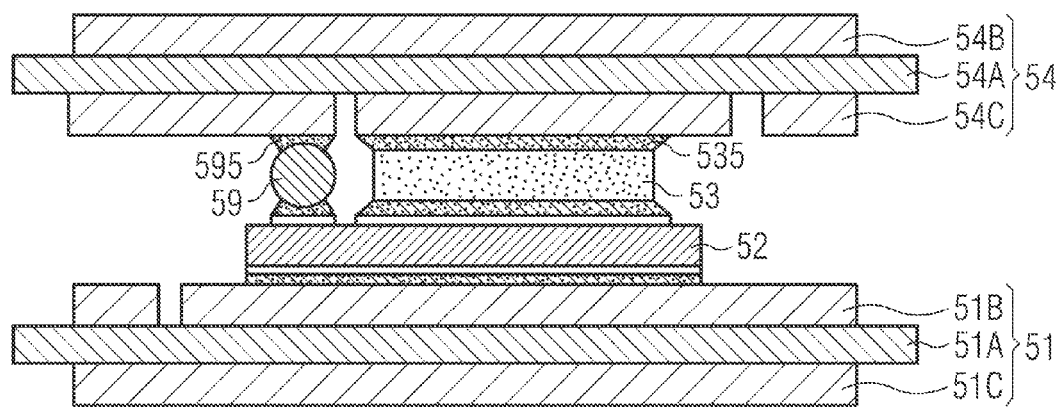

FIG. 5C shows an intermediate product of the method as a result of 407 of FIG. 4. A second substrate 54 has been attached to an upper surface of the spacer 53 and the solder ball 59 by soldering or sintering wherein the reference signs 535 and 595 denote the respective solder or sinter layers, respectively. The second substrate 54 comprises an insulating layer 54A, a first upper metallic layer 54B, and a second lower metallic layer 54C. The second metallic layer 54C is a structured metallic layer and the second substrate 54 is attached in such a way that the spacer layer 53 and the solder ball 59 are connected with particular portions or metallic lines of the second metallic layer 54C.

FIG. 5D shows an intermediate product as a result of 409 of FIG. 4. A leadframe 55, comprising a first lead 55.1 and a second lead 55.2, has been connected with the first and second substrates 51 and 54. In particular, upper surfaces of the first and second leads 55.1 and 55.2 have been connected by soldering or sintering to particular portions of the second metallic layer 54C of the second substrate 54, and lower surfaces of the first and second leads 55.1 and 55.2 have been connected by soldering or sintering to particular portions of the first metallic layer 51B of the first substrate 51. The reference signs 555 denote the respective solder or sinter layers. They can be applied to the first and second leads 55.1 and 55.2, then the intermediate product of FIG. 5C is brought into a position relative to the leadframe such as the position shown in FIG. 5D. Then a reflow process is carried out in an oven accompanied by clamping the first and second substrates 51 and 54 and the first and second leads 55.1 and 55.2 together by means of an appropriate clamping apparatus. During clamping the intermediate product is cooled down so that the solder or sinter layers 555 may solidify to obtain a stable connection between the substrates and the leads.

If solder layers are used, the material could be an SnSb solder, in particular one with additional getter elements like, for example, Ag or Cu increments, which are able to reduce the tendency of cracking in the solder.

FIG. 5E shows a semiconductor chip package as a result of 410 of FIG. 4. An encapsulant 56 has been applied to the intermediate product of FIG. 5D and is shown as a hatched area. The encapsulant 56 has been applied to the first and second substrates 51 and 54 and the first and second leads 55.1 and 55.2, and the encapsulant 56 has also been filled into the intermediate spaces between the IGBT chip 52 and the first and second leads 55.1 and 55.2, and also between the solder ball 59 and the second leads 55.2, between the solder ball 59 and the spacer layer 53, and between the spacer layer 53 and the first leads 55.1. The encapsulant 56 has been applied in such a way that portions of the second metallic layer 51C of the first substrate 51 and the first metallic layer 54B of the second substrate 54 are exposed to the outside.

FIG. 6 shows an electronic module according to the third aspect. The electronic module 600 of FIG. 6 comprises three semiconductor chip packages 61, 62 and 63 each of which comprising a structure of a semiconductor chip package according to the first aspect of the disclosure. In particular, each one of the semiconductor chip packages 61, 62 and 63 can be similar or identical in structure to the semiconductor chip 30 as shown in FIG. 3 and described above. The semiconductor chip packages 61, 62, and 63 may thus each form a half-bridge circuit so that the electronic module 600 comprises three half-bridge circuits which can be electrically connected with each other to be employed, for example, for driving a 3-phase motor.

The electronic module 600 can be passively or actively cooled. In particular, on both sides of the electronic module 600 a cooling substrate can be mounted which can be, for example, a simple heat sink in case of passive cooling or in case of active cooling a hollow metallic cooling box where a cooling medium is flowing through.

Example 1 is a semiconductor chip package comprising
a first substrate comprising an insulator layer, a first metallic layer disposed on a first upper main face of the insulator layer, and a second metallic layer disposed on a second lower main face of the insulator layer;
a first semiconductor chip comprising a first upper main disposed on the first main face, and a second contact pad disposed on the second main face, face and a second lower main face, a first contact wherein the first semiconductor chip is disposed on the first metallic layer of the first substrate, wherein the second contact pad is electrically connected with the first metallic layer;
a first electrically conductive spacer layer disposed on the first upper main face of the first semiconductor chip, wherein the first contact pad is electrically connected with the first spacer layer;
a second substrate comprising an insulator layer, a first metallic layer disposed on a first upper main face of the insulator layer, and a second metallic layer disposed on a second lower main face of the insulator layer, wherein the second substrate is disposed on the first spacer layer, wherein the second metallic layer is electrically connected with the first spacer layer;
a leadframe comprising a first lead and a second lead, wherein the first and second leads are disposed on opposing sides of the package and each one of the first and second leads comprises an upper surface and a lower surface, wherein the upper surfaces are connected with the second metallic layer of the second substrate, and the lower surfaces are connected with the first metallic layer of the first substrate; and
an encapsulant applied to the first and second substrates, the first semiconductor chip, the first spacer layer, and the leadframe.

In Example 2, the subject matter of Example 1 can optionally comprise the upper surfaces of the first and second leads are one or more of positively, form-fittingly or directly connected with the second metallic layer of the second substrate, and the lower surfaces of the first and second leads are one or more of positively, form-fittingly or directly connected with the first metallic layer of the first substrate.

In Example 3, the subject matter of Example 1 or Example 2 can optionally comprise a second semiconductor chip, wherein the first semiconductor chip is a semiconductor transistor chip and the second semiconductor chip is a semiconductor diode chip, wherein the semiconductor diode chip is connected in parallel to the semiconductor transistor chip.

In Example 4, the subject matter of one or more of Examples 1-3 can optionally comprise a second semiconductor chip comprising a first upper main face and a second lower main face, a first contact pad disposed on the first main face, and a second contact pad disposed on the second main face, wherein the second semiconductor chip is disposed on the first metallic layer of the first substrate, wherein the second contact pad is electrically connected with the first metallic layer.

In Example 5, the subject matter of one or more of Examples 1-4 can optionally comprise a second semiconductor chip disposed on the first substrate, and a second electrically conductive spacer layer disposed on the second semiconductor chip, wherein the second substrate is disposed on the second spacer layer.

In Example 6, the subject matter of one or more of Examples 1-5 can optionally comprise a second semiconductor chip, a third semiconductor chip, and a fourth semiconductor chip, wherein the second semiconductor chip is connected in parallel to the first semiconductor chip, and the fourth semiconductor chip is connected in parallel to the third semiconductor chip.

In Example 7, the subject matter of one or more of Examples 1-6 can optionally comprise a third contact pad disposed on the first main face of the first semiconductor chip, and a solder ball disposed on the third contact pad, wherein the solder ball is connected with the second metallic layer of the second substrate.

In Example 8, the subject matter of one or more of Examples 1-7 can optionally comprise a third contact pad disposed on the first main face of the first semiconductor chip, wherein the first semiconductor chip is a semiconductor transistor chip, the first contact pad is an emitter contact pad, the second contact pad is a collector contact pad, and the third contact pad is a gate contact pad, wherein the emitter contact pad is electrically connected with the first leads, and the gate contact pad is electrically connected with the second lead.

In Example 9, the subject matter of one or more of Examples 1-8 can optionally comprise the second metallic layer of the second substrate is a structured layer comprising metallic lines connected with the first or second leads of the leadframe.

In Example 10, the subject matter of one or more of Examples 1-9 can optionally comprise the first spacer layer is made of Cu, Cu alloy, or a Cu refractory composite.

In Example 11, the subject matter of one or more of Examples 1-10 can optionally comprise applying the encapsulant in such a way that a portion of the second metallic layer of the first substrate is exposed to the outside, and a portion of the first metallic layer of the second substrate is exposed to the outside.

Example 12 is an electronic module comprising two or more semiconductor chip packages, wherein each one of the semiconductor chip packages comprises
  a first substrate comprising an insulator layer, a first metallic layer disposed on a first upper main face of the insulator layer, and a second metallic layer disposed on a second lower main face of the insulator layer;
  a first semiconductor chip comprising a first upper main face and a second lower main face, a first contact pad disposed on the first main face, and a second contact pad disposed on the second main face, wherein the first semiconductor chip is disposed on the first metallic layer of the first substrate, wherein the second contact pad is electrically connected with the first metallic layer;
  a first electrically conductive spacer layer disposed on the first upper main face of the first semiconductor chip, wherein the first contact pad is electrically connected with the first spacer layer;
  a second substrate comprising an insulator layer and a first metallic layer disposed on a first upper main face of the insulator layer, and a second metallic layer disposed on a second lower main face of the insulator layer, wherein the second substrate is disposed on the first spacer layer, wherein the second metallic layer is electrically connected with the first spacer layer;
  a leadframe comprising a first lead and a second lead, wherein the first and second leads are disposed on opposing sides of the package and each one of the first and second leads comprises an upper surface and a lower surface, wherein the upper surface is connected with the second metallic layer of the second substrate, and the lower surface is connected with the first metallic layer of the first substrate; and
  an encapsulant applied to the first and second substrates, the first semiconductor chip, the first spacer layer, and the leadframe.

In Example 13, the subject matter of Example 12 can optionally comprise each one of the semiconductor chip packages comprises a first semiconductor chip, a second semiconductor chip, a third semiconductor chip, and a fourth semiconductor chip, wherein the first and third semiconductor chips are semiconductor transistor chips, and the second and fourth semiconductor chips are semiconductor diode chips.

In Example 14, the subject matter of Examples 12 or 13 can optionally comprise each one of the semiconductor chip packages comprises a first semiconductor chip, a second semiconductor chip, a third semiconductor chip, and a fourth semiconductor chip, wherein the second semiconductor chip is connected in parallel to the first semiconductor chip, and the fourth semiconductor chip is connected in parallel to the third semiconductor chip.

In Example 15, the subject matter of one or more of Examples 12-14 can optionally comprise each one of the semiconductor chip packages comprises a further semiconductor chip, wherein the first semiconductor chip and the further semiconductor chip are semiconductor transistor chips connected in series with each other and with the first and second leads so as to form a half-bridge circuit.

In Example 16, the subject matter of one or more of Examples 12-15 can optionally comprise electrically interconnecting the two or more semiconductor chip packages to form an inverter circuit or a converter circuit.

Example 17 is a method for fabricating a semiconductor chip package, the method comprising
  providing a first substrate comprising an insulator layer, a first metallic layer disposed on a first upper main face of the insulator layer, and a second metallic layer disposed on a second lower main face of the insulator layer;
  providing a first semiconductor chip having a first upper main face and a second lower main face, a first contact pad disposed on the first main face, and a second contact pad disposed on the second main face;
  disposing the first semiconductor chip on the first metallic layer of the substrate;
  providing a first electrically conductive spacer layer;
  disposing the first spacer layer on the first upper main face of the first semiconductor chip so that the first contact pad is electrically connected with the first spacer layer;
  providing a second substrate comprising an insulator layer, a first metallic layer disposed on a first main face of the insulator layer, and a second metallic layer disposed on a second lower main face of the insulator layer;
  disposing the second substrate on the first spacer layer;
  providing a leadframe comprising a first lead and a second lead disposed in an opposing relationship to each other, each one of the first leads and the second leads comprising an upper surface and a lower surface;
  connecting the leadframe to the substrate by connecting the upper surfaces of the first and second leads with the second metallic layer of the second substrate, and connecting the lower surfaces of the first and second leads with the first metallic layer of the first substrates;
  and applying an encapsulant to the first and second substrates, the first semiconductor chip, the first spacer layer, and the leadframe.

In Example 18, the subject matter of Example 17 can optionally comprise connecting the leadframe to the substrate comprises connecting the upper surfaces of the first and second leads one or more of positively, form-fittingly or directly with the second metallic layer of the second substrate; and connecting the lower surfaces of the first and second leads one or more of positively, form-fittingly or directly with the first metallic layer of the first substrate.

In Example 19, the subject matter of example 17 or Example 18 can optionally comprise connecting the leadframe to the substrate comprises connecting the upper surfaces of the first and second leads by a solder layer or a sinter layer with the second metallic layer of the second substrate; and connecting the lower surfaces of the first and second leads by a solder layer or a sinter layer with the first metallic layer of the first substrate.

In Example 20, the subject matter of one or more of Examples 17-19 can optionally comprise simultaneously connecting the upper surfaces of the first and second leads with the second metallic layer of the second substrate; and connecting the lower surfaces of the first and second leads with the first metallic layer of the first substrate.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor chip package, comprising:
    a first substrate comprising an insulator layer, a first metallic layer disposed on a first upper main face of the insulator layer, and a second metallic layer disposed on a second lower main face of the insulator layer;
    a first semiconductor chip comprising a first upper main face and a second lower main face, a first contact disposed on the first main face, and a second contact pad disposed on the second main face, wherein the first semiconductor chip is disposed on the first metallic layer of the first substrate, wherein the second contact pad is electrically connected with the first metallic layer;
    a first electrically conductive spacer layer disposed on the first upper main face of the first semiconductor chip, wherein the first contact pad is electrically connected with the first spacer layer;
    a second substrate comprising an insulator layer, a first metallic layer disposed on a first upper main face of the insulator layer, and a second metallic layer disposed on a second lower main face of the insulator layer, wherein the second substrate is disposed on the first spacer layer, wherein the second metallic layer is electrically connected with the first spacer layer;
    a leadframe comprising a first lead and a second lead, wherein the first and second leads are disposed on opposing sides of the package and each one of the first and second leads comprises an upper surface and a lower surface, wherein the upper surfaces are connected with the second metallic layer of the second substrate, and the lower surfaces are connected with the first metallic layer of the first substrate; and
    an encapsulant applied to the first and second substrates, the first semiconductor chip, the first spacer layer, and the leadframe.

2. The semiconductor chip package according to claim 1, wherein
    the upper surfaces of the first and second leads are one or more of positively, form-fittingly or directly connected with the second metallic layer of the second substrate, and the lower surfaces of the first and second leads are one or more of positively, form-fittingly or directly connected with the first metallic layer of the first substrate.

3. The semiconductor chip package according to claim 1, further comprising:
    a second semiconductor chip, wherein the first semiconductor chip is a semiconductor transistor chip and the second semiconductor chip is a semiconductor diode chip, wherein the semiconductor diode chip is connected in parallel to the semiconductor transistor chip.

4. The semiconductor chip package according to claim 1, further comprising:
    a second semiconductor chip comprising a first upper main face and a second lower main face, a first contact pad disposed on the first main face, and a second contact pad disposed on the second main face, wherein the second semiconductor chip is disposed on the first metallic layer of the first substrate, wherein the second contact pad is electrically connected with the first metallic layer.

5. The semiconductor chip package according to claim 1, further comprising:
    a second semiconductor chip disposed on the first substrate; and
    a second electrically conductive spacer layer disposed on the second semiconductor chip, wherein the second substrate is disposed on the second spacer layer.

6. The semiconductor chip package according to claim 1, further comprising:
    a second semiconductor chip, a third semiconductor chip, and a fourth semiconductor chip; wherein
    the second semiconductor chip is connected in parallel to the first semiconductor chip, and the fourth semiconductor chip is connected in parallel to the third semiconductor chip.

7. The semiconductor chip package according to claim 1, further comprising:
    a third contact pad disposed on the first main face of the first semiconductor chip; and
    a solder ball disposed on the third contact pad, wherein the solder ball is connected with the second metallic layer of the second substrate.

8. The semiconductor chip package according to claim 1, further comprising:
    a third contact pad disposed on the first main face of the first semiconductor chip; wherein
    the first semiconductor chip is a semiconductor transistor chip, the first contact pad is an emitter contact pad, the second contact pad is a collector contact pad, and the third contact pad is a gate contact pad; wherein
    the emitter contact pad is electrically connected with the first lead, and the gate contact pad is electrically connected with the second lead.

9. The semiconductor chip package according to claim 1, wherein
    the second metallic layer of the second substrate is a structured layer comprising metallic lines connected with the first or second leads of the leadframe.

10. The semiconductor chip package according to claim 1, wherein
    the first spacer layer is made of Cu, Cu alloy, or a Cu refractory composite.

11. The semiconductor chip package according to claim 1, wherein
    the encapsulant is applied in such a way that a portion of the second metallic layer of the first substrate is exposed to the outside, and a portion of the first metallic layer of the second substrate is exposed to the outside.

12. An electronic module, comprising:
    two or more semiconductor chip packages, wherein each one of the semiconductor chip packages comprises:
        a first substrate comprising an insulator layer, a first metallic layer disposed on a first upper main face of the insulator layer, and a second metallic layer disposed on a second lower main face of the insulator layer;

a first semiconductor chip comprising a first upper main face and a second lower main face, a first contact pad disposed on the first main face, and a second contact pad disposed on the second main face, wherein the first semiconductor chip is disposed on the first metallic layer of the first substrate, wherein the second contact pad is electrically connected with the first metallic layer;

a first electrically conductive spacer layer disposed on the first upper main face of the first semiconductor chip, wherein the first contact pad is electrically connected with the first spacer layer;

a second substrate comprising an insulator layer and a first metallic layer disposed on a first upper main face of the insulator layer, and a second metallic layer disposed on a second lower main face of the insulator layer, wherein the second substrate is disposed on the first spacer layer, wherein the second metallic layer is electrically connected with the first spacer layer;

a leadframe comprising a first lead and a second lead, wherein the first and second leads are disposed on opposing sides of the package and each one of the first and second leads comprises an upper surface and a lower surface, wherein the upper surfaces are connected with the second metallic layer of the second substrate, and the lower surfaces are connected with the first metallic layer of the first substrate; and an encapsulant applied to the first and second substrates, the first semiconductor chip, the first spacer layer, and the leadframe.

13. The electronic module according to claim 12, wherein each one of the semiconductor chip packages comprises a first semiconductor chip, a second semiconductor chip, a third semiconductor chip, and a fourth semiconductor chip, wherein the first and third semiconductor chips are semiconductor transistor chips, and the second and fourth semiconductor chips are semiconductor diode chips.

14. The electronic module according to claim 12, wherein each one of the semiconductor chip packages comprises a first semiconductor chip, a second semiconductor chip, a third semiconductor chip, and a fourth semiconductor chip, wherein the second semiconductor chip is connected in parallel to the first semiconductor chip, and the fourth semiconductor chip is connected in parallel to the third semiconductor chip.

15. The electronic module according to claim 12, wherein each one of the semiconductor chip packages comprises a further semiconductor chip, wherein the first semiconductor chip and the further semiconductor chip are semiconductor transistor chips connected in series with each other and with the first and second leads so as to form a half-bridge circuit.

16. The electronic module according to claim 12, wherein the two or more semiconductor chip packages are electrically interconnected to form an inverter circuit or a converter circuit.

17. A method for fabricating a semiconductor chip package, the method comprising:

providing a first substrate comprising an insulator layer, a first metallic layer disposed on a first upper main face of the insulator layer, and a second metallic layer disposed on a second lower main face of the insulator layer;

providing a first semiconductor chip having a first upper main face and a second lower main face, a first contact pad disposed on the first main face, and a second contact pad disposed on the second main face;

disposing the first semiconductor chip on the first metallic layer of the substrate;

providing a first electrically conductive spacer layer;

disposing the first spacer layer on the first upper main face of the first semiconductor chip so that the first contact pad is electrically connected with the first spacer layer;

providing a second substrate comprising an insulator layer, a first metallic layer disposed on a first main face of the insulator layer, and a second metallic layer disposed on a second lower main face of the insulator layer;

disposing the second substrate on the first spacer layer;

providing a leadframe comprising a first lead and a second lead disposed in an opposing relationship to each other, each one of the first and second leads comprising an upper surface and a lower surface;

connecting the leadframe to the substrate by connecting the upper surfaces of the first and second leads with the second metallic layer of the second substrate, and connecting the lower surfaces of the first and second leads with the first metallic layer of the first substrates; and applying an encapsulant to the first and second substrates, the first semiconductor chip, the first spacer layer, and the leadframe.

18. The method according to claim 17, further comprising:

connecting the leadframe to the substrate comprises connecting the upper surfaces of the first and second leads one or more of positively, form-fittingly or directly with the second metallic layer of the second substrate; and connecting the lower surfaces of the first and second leads one or more of positively, form-fittingly or directly with the first metallic layer of the first substrate.

19. The method according to claim 17, further comprising:

connecting the leadframe to the substrate comprises connecting the upper surfaces of the first and second leads by a solder layer or a sinter layer with the second metallic layer of the second substrate; and connecting the lower surfaces of the first and second leads by a solder layer or a sinter layer with the first metallic layer of the first substrate.

20. The method according to claim 17, further comprising:

connecting the leadframe to the substrate comprises simultaneously connecting the upper surfaces of the first and second leads with the second metallic layer of the second substrate; and connecting the lower surfaces of the first and second leads with the first metallic layer of the first substrate.

* * * * *